United States Patent
Yamada et al.

(10) Patent No.: US 8,735,907 B2
(45) Date of Patent: May 27, 2014

(54) OHMIC ELECTRODE FOR USE IN A SEMICONDUCTOR DIAMOND DEVICE

(75) Inventors: Takatoshi Yamada, Tsukuba (JP); Somu Kumaragurubaran, Tsukuba (JP); Shinichi Shikata, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 83 days.

(21) Appl. No.: 13/386,067

(22) PCT Filed: Jul. 21, 2010

(86) PCT No.: PCT/JP2010/062219
§ 371 (c)(1),
(2), (4) Date: Feb. 13, 2012

(87) PCT Pub. No.: WO2011/010654
PCT Pub. Date: Jan. 27, 2011

(65) Prior Publication Data
US 2012/0132928 A1 May 31, 2012

(30) Foreign Application Priority Data
Jul. 22, 2009 (JP) ................................ 2009-170667

(51) Int. Cl.
*H01L 29/15* (2006.01)
*H01L 23/48* (2006.01)
*H01L 21/00* (2006.01)
*H01L 21/44* (2006.01)

(52) U.S. Cl.
USPC 257/77; 257/741; 257/E21.005; 257/E21.604; 438/105; 438/652

(58) Field of Classification Search
None
See application file for complete search history.

(56) References Cited

U.S. PATENT DOCUMENTS

| | | | | |
|---|---|---|---|---|
| 3,890,699 | A | * | 6/1975 | Vilms ........................... 438/605 |
| 5,055,424 | A | * | 10/1991 | Zeidler et al. ................. 438/105 |
| 5,210,431 | A | * | 5/1993 | Kimoto et al. .................. 257/77 |
| 5,309,000 | A | * | 5/1994 | Saito et al. ...................... 257/76 |
| 5,389,799 | A | * | 2/1995 | Uemoto .......................... 257/77 |
| 5,493,131 | A | * | 2/1996 | Miyata et al. ................... 257/77 |
| 5,609,926 | A | * | 3/1997 | Prins ............................. 427/523 |
| 6,140,148 | A | * | 10/2000 | Prins ............................. 438/105 |
| 2005/0097941 | A1 | * | 5/2005 | Sandvik et al. .............. 73/31.06 |
| 2009/0278150 | A1 | * | 11/2009 | Lee et al. ........................ 257/98 |

FOREIGN PATENT DOCUMENTS

| | | |
|---|---|---|
| JP | 01-243511 | 9/1989 |
| JP | 10-081587 | 3/1998 |

OTHER PUBLICATIONS

M. Suzuki et al., Appl. Phys. Lett. vol. 84 (2004) pp. 2349-2351 (7 pages).

\* cited by examiner

*Primary Examiner* — Julio J Maldonado
*Assistant Examiner* — Harpreet Singh
(74) *Attorney, Agent, or Firm* — Flynn, Thiel, Boutell & Tanis, P.C.

(57) ABSTRACT

In a semiconductor diamond device, there is provided an ohmic electrode that is chemically and thermally stable and has an excellent low contact resistance and high heat resistance. A nickel-chromium alloy, or a nickel-chromium compound, containing Ni and Cr such as $Ni_6Cr_2$ or $Ni_{72}Cr_{18}Si_{10}$, which is chemically and thermally stable, is formed on a semiconductor diamond by a sputtering process and so forth, to thereby obtain the semiconductor diamond device provided with an excellent ohmic electrode. If heat treatment is applied after forming the nickel-chromium alloy or compound, it is improved in characteristics.

6 Claims, 5 Drawing Sheets

OHMIC ELECTRODE FOR USE IN A SEMICONDUCTOR DIAMOND DEVICE

TECHNICAL FIELD

The present invention relates to an ohmic electrode formed on a diamond semiconductor which has a low contact resistance and high heat resistance, a semiconductor diamond device provided with the ohmic electrode and a method for manufacturing the semiconductor diamond device.

BACKGROUND TECHNOLOGY

In the fields of application of a diamond electronic device and an optical device, respectively, it is important to develop an ohmic electrode which has excellent low contact resistance and heat resistance. It has been known that Patent Documents 1 to 5 each describe a technology for forming an ohmic electrode on a semiconductor diamond as a prior art technology. For example, there has been introduced a technology whereby a metal layer is provided on a semiconductor diamond through the intermediary of a graphite layer to thereby form an ohmic junction (Patent Document 1).

Further, as a method for forming an ohmic electrode against a p-type semiconductor diamond, there has been introduced the method whereby elements, such as Ti, Mo, Ta, Zr, Hf, and so forth, reacting with a diamond to form a metal carbide is deposited on the diamond to be followed by a heat treatment applied at not lower than 400° C., thereby forming an ohmic electrode (refer to Patent Documents 2, 3).

Furthermore, as the method for forming an ohmic electrode against an n-type semiconductor diamond, there has been tried the method whereby Ti capable of forming a metal carbide is deposited on the diamond, and a heat treatment is applied thereto at not lower than 600° C. However, with this method, it has been difficult to form an ohmic electrode because of the presence of a barrier formed at an interface (Non-patent Document 1). Meanwhile, use is made of the method whereby Al that is small in work function is formed in a layer added with dopant ions of not less than $1.0 \times 10^{20}$ cm$^{-3}$ (Patent Document 4). However, in this case, a problem remains in that insufficiency in heat resistance, and rectifying properties, is observed. It has been reported that if a metal-diamond transition phase is formed by the implantation of Ga ions, an ohmic electrode can be formed without the application of a heat treatment (Patent Document 4). However, an ion implantation layer cannot be used as an electrode, so that there remain problems in terms of processing, including the necessity of further forming a surface layer of Au, and so forth.

Further, it has been known that for an ohmic electrode on a hydrogen-terminated semiconductor diamond, use is made of gold and platinum, and for a Schottky-barrier forming electrode, use is made of copper, nickel, tungsten, iron, chromium, and so forth (Patent Document 6).

Furthermore, it has been known that a contact resistance was evaluated by the c-TML method using a Ti electrode having an intermediate layer highly doped with phosphorus ions on the order of $1.2 \times 10^{20}$ cm$^{-3}$ on an n-type semiconductor diamond, and the contact resistance was at $2 \times 10^{-3}$ Ωcm$^2$ (refer to Non-patent Document 4). Even if the Ti electrode has an intermediate layer that is highly doped, a heat treatment at 420° C. is required of the Ti electrode. Herein, the c-TML method is a method whereby a dual-electrode structure is comprised of a circular electrode, and a doughnut-shaped electrode, combined with each other so as to form a concentric ring structure, a plurality of the dual-electrode structures are prepared, differing in inter-electrode distance from each other, and current/voltage characteristics at the respective inter-electrode distances are measured, thereby working out (hereinafter referred to also as "estimating") a contact resistance on the basis of the current/voltage characteristics.

PRIOR ART REFERENCES

Patent Documents

Patent Document 1: JP 5-891A
Patent Document 2: JP 7-78784A
Patent Document 3: JP 6-236855A
Patent Document 4: JP 2001-77048A
Patent Document 5: JP 2002-26391A
Patent Document 6: JP 9-312300A

Non-Patent Documents

Non-Patent Document 1: T. Teraji et al., Phys. Stat. Sold. (a) vol181 (2000) pp 129-139
Non-Patent Document 2: M. Suzuki et al., Appl. Phys. Lett. vol84 (2004) pp 2349-2351
Non-Patent Document 3: M. Suzuki et al., Diam. Relat. Mater. Vol13 (2004) pp 198-202
Non-Patent Document 4: H. Kato et al., Appl. Phys. Lett. Vol93 (2008) 202103

SUMMARY OF THE INVENTION

Problems to be Solved by the Invention

A prior art technology for forming an ohmic electrode having excellent performance on a semiconductor diamond has had a problem in that insufficiency in heat resistance and rectifying properties are observed. Further, the technology has had a problem in that a heat treatment is required in order to form the ohmic electrode. Still further, the technology has had a problem in that it is difficult to form an ohmic electrode having an excellent performance on an n-type semiconductor diamond. For example, in the case of the prior art technology introduced in Patent Document 1, the graphite layer is formed between the metal ohmic electrode and the diamond. A method for forming an intermediate layer, such as a highly doped layer, and a depletion layer, at an interface between a semiconductor and a metal in order to form an ohmic electrode, as in the case of this prior art technology, is a common method, and this method is known to have many options for selecting a metal electrode material because an ohmic electrode is formed through the intermediary of the intermediate layer. The method, however, has a problem of an increase in the number of process steps for formation because the intermediate layer is required, and therefore, a method capable of forming an ohmic electrode directly on a semiconductor diamond is highly desired.

Meanwhile, Cr is known to show ohmic properties against a p-type semiconductor diamond doped with boron. It is known that a metal element showing ohmic properties against the p-type semiconductor forms, in theory, a barrier against an n-type semiconductor, so that an ohmic electrode is not formed on the n-type semiconductor. Further, it has been reported that Ni shows rectifying properties against an n-type semiconductor diamond, further showing the rectifying properties even at 200° C. (Non-patent Document 2). Thus, an Ni electrode has since been known as an electrode for use in a Schottky diode, having excellent performance, against a diamond (Non-patent Documents 2, 3, and Patent Document 6).

In view of such a background as described, for an ohmic electrode, use has not been made of a metal alloy containing Ni. This is the reason why no study has ever been made on the use of Ni only, and an alloy, or a compound containing Ni, for an ohmic electrode. Furthermore, Ni has had a problem with heat resistance because Ni acts as a solvent against carbon to cause erosion of a diamond from the surface to the interior thereof.

Objects of the Invention

The present invention is intended to solve these problems, and it is therefore an object of the invention to provide an ohmic electrode that is chemically and thermally stable, and has an excellent low contact resistance and high heat resistance, and serves as an ohmic electrode for use in a semiconductor diamond. Further, it is an object of the invention to provide an ohmic electrode that can be formed directly on a semiconductor diamond. Still further, it is an object of the invention to provide a method for manufacturing a semiconductor diamond device, that is, a method whereby an ohmic electrode having an excellent low contact resistance and high heat resistance is formed. Furthermore, it is an object of the invention to provide an ohmic electrode without requiring a heat treatment.

The inventors, et al. have found out that, for an ohmic electrode, use can be made of an alloy comprised of elements Ni and Cr, the elements being chemically and thermally stable. There has since been proposed a method (Patent Document 5) for forming an NiCr ohmic electrode by applying a heat treatment at a temperature in a range of 400 to 700° C. to a GaN semiconductor. However, it is known that as a semiconductor material differs in the type of conductivity, so an ohmic electrode material generally does in the type of conductivity and, therefore, ohmic properties against a semiconductor diamond cannot be predicted.

In order to solve the problems described above, with the present invention, an NiCr alloy, or a compound containing NiCr, both chemically and thermally stable, is used for an ohmic electrode. For the Ni—Cr alloy, or the compound containing NiCr, use can be made of an alloy comprised of Ni and Cr only, an alloy containing NiCr as a major constituent together with at least one element selected from the group consisting of Fe, Ti, Mn, Mo, Nb, Cu, Al, W, Ta and Ga, and a compound containing Ni and Cr, and other elements (Si, C, and N). The present invention is concerned with an ohmic electrode formed on a semiconductor diamond, and the semiconductor diamond can be either of n-type conductivity or p-type conductivity. The n-type conductivity is more preferable. With the present invention, in the manufacturing of the semiconductor diamond device, the NiCr alloy, or the compound containing NiCr is used for the ohmic electrode, thereby obtaining an ohmic electrode having an excellent low contact resistance and high heat resistance. Further, in order to obtain an ohmic electrode having excellent performance, a heat treatment can also be applied.

In order to achieve the objects described above, the invention has the following features.

In accordance with a first aspect of the present invention, there is provided an ohmic electrode for use in a semiconductor diamond device, comprising a nickel-chromium alloy or a nickel-chromium compound, containing Ni and Cr. Further, in accordance with a second aspect of the present invention, there is provided a semiconductor diamond device comprising a semiconductor diamond, wherein an ohmic electrode comprised of a nickel-chromium alloy, or a nickel-chromium compound, containing Ni and Cr, is provided on the semiconductor diamond. Still further, the present invention in its third aspect provides a method for manufacturing a semiconductor diamond device, comprising the steps of preparing a semiconductor diamond and forming an ohmic electrode on the semiconductor diamond, the ohmic electrode being comprised of a nickel-chromium alloy, or a nickel-chromium compound, containing Ni and Cr.

With the present invention, the ohmic electrode for use in the semiconductor diamond device can be obtained by use of NiCr, the NiCr alloy, or the compound containing NiCr, as constituent materials for the electrode. The ohmic electrode according to the present invention has an excellent low contact resistance, and high heat resistance. Further, with the present invention, the ohmic electrode can be formed on a semiconductor diamond so as to be in direct contact therewith, so that the conventional intermediate layer is not required, and a manufacturing process is simplified. Further, use of the constituent materials for the electrode, according to the present invention, has an advantageous effect in that a heating step is unnecessary. Still further, with the manufacturing method according to the present invention, an ohmic electrode having excellent performance can be obtained by application of a heat treatment at a predetermined temperature. If a heat treatment is applied at a heat treatment temperature in a range of 420 to 1000° C., this will cause the contact resistance to be reduced and ohmic properties to be improved. The heat treatment temperature in a range of 700 to 1000° C. is more preferable from the viewpoint of further reduction in contact resistance.

BEST MODE FOR CARRYING OUT THE INVENTION

With the present invention, for manufacturing of an ohmic electrode, use is made of an alloy, or a compound, containing elements Ni and Cr, the elements being both chemically and thermally stable. The ohmic electrode according to the present invention can be formed by the previously known method for forming an alloy, or a compound, such as a sputtering process using a plasma, an ion beam, and so forth. With respective embodiments of the invention, described hereinafter, there is shown an example in which an RF plasma sputtering process is adopted. The present invention is described hereinafter by referring to the respective embodiments.

Embodiment 1

Figure 1:
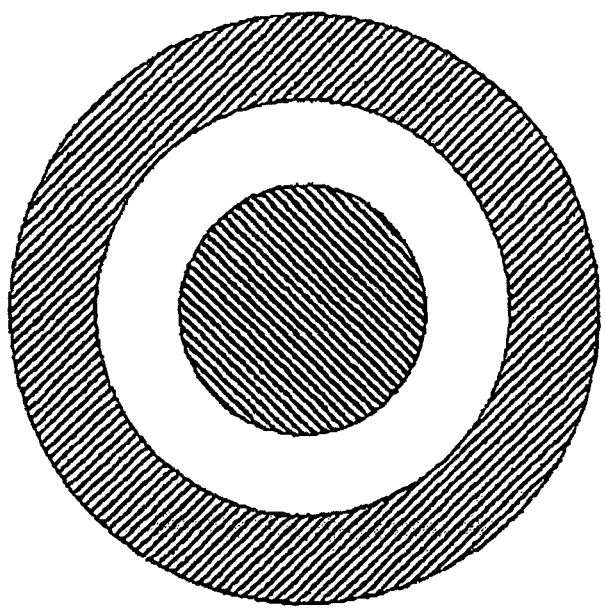
FIG. 1 shows an electrode structure for the evaluation of the characteristics of an electrode according to the present invention.
Figure 2:
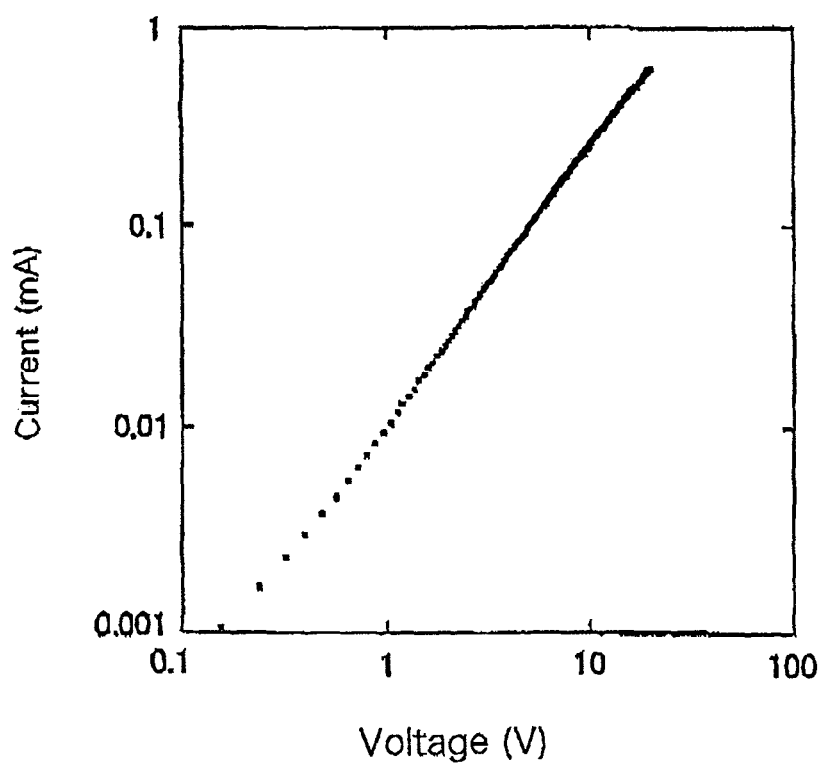
FIG. 2 shows a current/voltage characteristic of an electrode according to Embodiment 1 of the present invention.

An $Ni_{80}Cr_{20}$ electrode was formed on an oxygen-terminated, and n-type semiconductor diamond doped with phosphorus. FIG. 1 shows an electrode structure for evaluation of the characteristics of an electrode to be used in the respective embodiments. As shown in FIG. 1, the electrode structure is comprised of two electrodes, including a circular electrode indicated by diagonal lines and a doughnut-shaped electrode similarly indicated by diagonal lines, to thereby form a concentric ring structure. An interval between the electrodes is 20 μm. The $Ni_{80}Cr_{20}$ electrode was deposited by a sputtering process with the use of $Ni_{80}Cr_{20}$ as a target. In the sputtering, use was made of an RF plasma sputtering system where the $Ni_{80}Cr_{20}$ electrode was deposited at 0.5 Pa of Ar gas pressure and at 200 w of RF power. In this case, $Ni_{80}Cr_{20}$ was used as the target. The electrode structure was prepared by a lift off method after patterning by use of an electron beam lithography and forming an $Ni_{80}Cr_{20}$ film. Thereafter, a heat treatment at 420° C. was applied thereto in Ar gas. For the semiconductor diamond, use was made of an n-type semiconductor diamond doped with phosphorus ions on the order of $2\times10^{20}$ $cm^{-3}$, deposited on a high-temperature, and high-pressure synthetic Ib diamond substrate by a microwave plasma enhanced CVD method. In this case, the direction of the crystal plane was the (111) plane. An oxygen-terminated structure was formed by applying a boiling treatment in a mixed solution of sulfuric acid and nitric acid at temperatures not lower than 200° C. for a period of not less than 60 minutes. A current/voltage measurement was taken by applying a voltage across the two electrodes to thereby evaluate the current flowing therebetween. The measurement was taken at room temperature. In FIG. 2, there is shown a current/voltage characteristic representing measurement results. It is evident from the current/voltage characteristic shown in FIG. 2 that as an applied voltage increases, so does the current in magnitude. The $Ni_{80}Cr_{20}$ electrode formed directly on the n-type semiconductor diamond doped with phosphorus is shown to have an excellent ohmic electrode characteristic.

Embodiment 2

Figure 3:
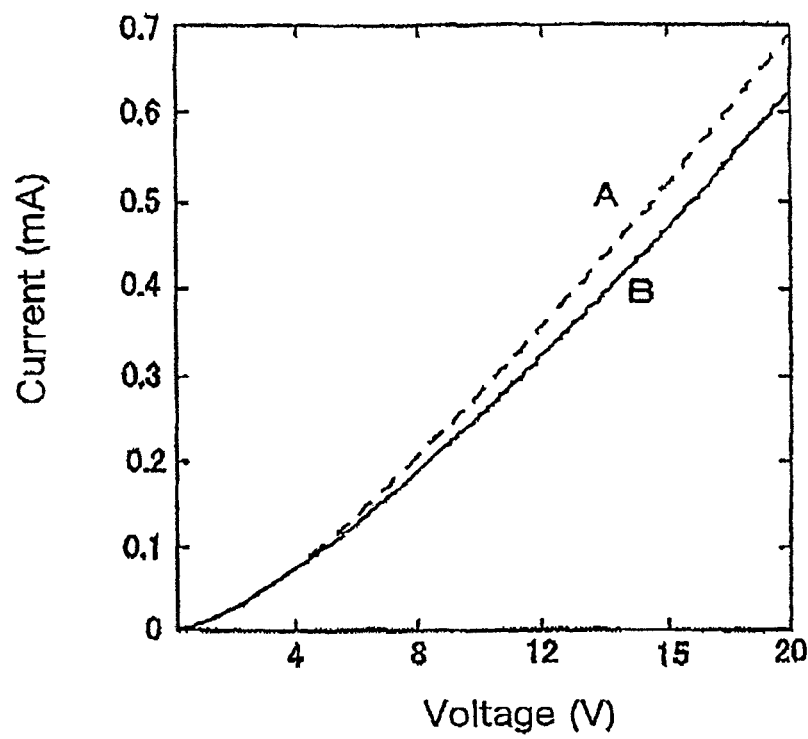
FIG. 3 shows a current/voltage characteristic of an electrode according to Embodiment 2 of the present invention.

A $Ni_{85}Cr_{15}$ electrode, which has the same electrode structure as Embodiment 1 shown in FIG. 1 and changed in compositional ratio of Ni and Cr, was formed on an oxygen-terminated and n-type semiconductor diamond. The NiCr was deposited by a sputtering process. In the sputtering, use was made of an RF plasma sputtering system where the $Ni_{85}Cr_{15}$ electrode was deposited at 0.5 Pa of Ar gas pressure and at 200 w of RF power. In this case, $Ni_{85}Cr_{15}$ was used as the target. The $Ni_{85}Cr_{15}$ electrode was prepared by a lift off method after patterning by use of electron beam lithography. Thereafter, a heat treatment at 420° C. and 700° C. under two conditions was applied thereto in Ar gas. For the semiconductor diamond, use was made of an n-type semiconductor diamond doped with phosphorus ions on the order of $2\times10^{20}$ $cm^{-3}$, deposited on a high-temperature and high-pressure synthetic Ib diamond substrate by a microwave plasma enhanced CVD method. In this case, the direction of the crystal plane was the (111) plane. An oxygen-terminated structure was formed by applying a boiling treatment in a mixed solution of sulfuric acid and nitric acid at temperatures not lower than 200° C. for a period of not less than 60 minutes. A current/voltage characteristic was taken by applying a voltage across the two electrodes to thereby evaluate the current flowing therebetween in the same manner as made in Embodiment 1. The measurement was taken at room temperature. In FIG. 3, there is shown the current/voltage characteristic representing measurement results. In FIG. 3, a dotted line A indicates the characteristic of an $Ni_{85}Cr_{15}$ electrode subjected to the heat treatment applied at 700° C., and a solid line B indicates the characteristic of an $Ni_{85}Cr_{15}$ electrode subjected to the heat treatment applied at 420° C. It is evident from the current/voltage characteristic shown in FIG. 3 that as an applied voltage increases, so does a current value at either of the heat treatment temperatures. Further, it was observed that a current value at 20V of the applied voltage when the heat treatment was applied at 700° C. was 1.1 times as much as that when the heat treatment was applied at 420° C. It was confirmed that, in the case of the heat treatment applied at 700° C. (the dotted line A), a current flows with greater ease as compared with the case of the heat treatment applied at 420° C. (the solid line B), as shown in FIG. 3. Further, it was confirmed that an operation was stabilized even at the heat treatment applied up to 900° C.

Embodiment 3

Figure 4:
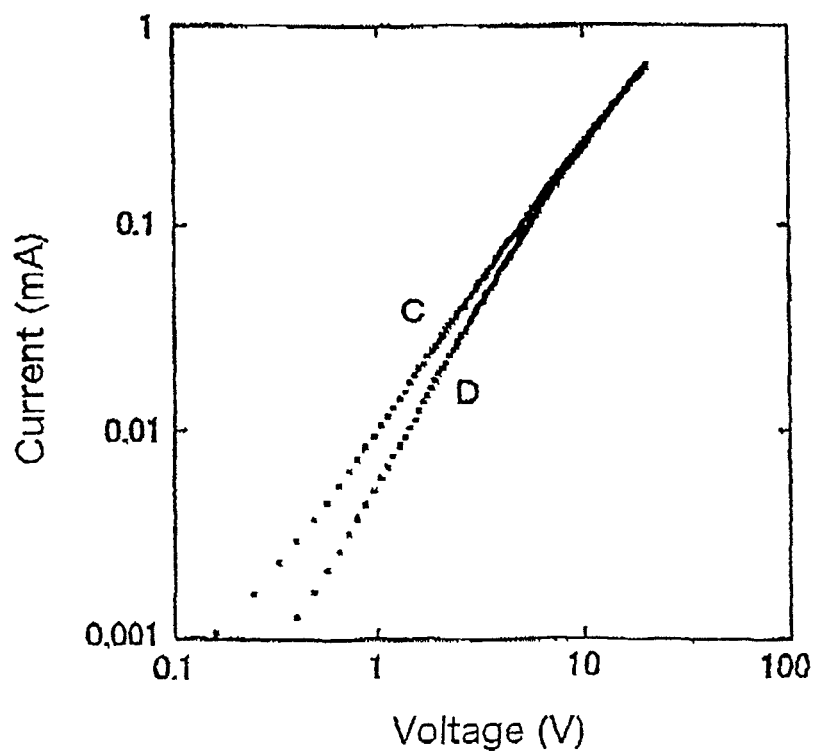
FIG. 4 shows a current/voltage characteristic of an electrode according to Embodiment 3 of the present invention.

Two $Ni_{72}Cr_{18}Si_{10}$ electrodes were formed on an oxygen-terminated, and n-type semiconductor diamond, as shown in FIG. 1. The $Ni_{72}Cr_{18}Si_{10}$ was deposited by a sputtering process. In the sputtering, use was made of an RF plasma sputtering system where the $Ni_{72}Cr_{18}Si_{10}$ electrodes were deposited at 0.5 Pa of Ar gas pressure and at 200 w of RF power. In this case, $Ni_{72}Cr_{18}Si_{10}$ was used as the target. The $Ni_{72}Cr_{18}Si_{10}$ electrodes were prepared by a lift off method after patterning by use of electron beam lithography. Thereafter, a heat treatment at 420° C. was applied thereto in Ar gas. For the semiconductor diamond, use was made of an n-type semiconductor diamond doped with phosphorus ions on the order of $2\times10^{20}$ $cm^{-3}$, deposited on a high-temperature, and high-pressure synthetic Ib diamond substrate by a microwave plasma enhanced CVD method. In this case, the direction of the crystal plane was the (111) plane. An oxygen-terminated structure was formed by applying a boiling treatment in a mixed solution of sulfuric acid and nitric acid at temperatures not lower than 200° C. for a period of not less than 60 minutes. In FIG. 4, there is shown a current/voltage characteristic representing measurement results. In FIG. 4, a line D indicates the characteristic of the $Ni_{72}Cr_{18}Si_{10}$ electrodes according to Embodiment 3 and a line C indicates the characteristic of the $Ni_{80}Cr_{20}$ electrode according to embodiment 1. It was found out from the current/voltage characteristic shown in FIG. 4 that, as an applied voltage increased, so did the current value. Further, it was observed according to the electrodes of Embodiment 3, that a current value was low at a low voltage but a current value was equivalent at a high voltage. It was confirmed from the measurement results that the $Ni_{72}Cr_{18}Si_{10}$ electrodes each are an excellent ohmic electrode.

Comparative Example 1

Figure 5:
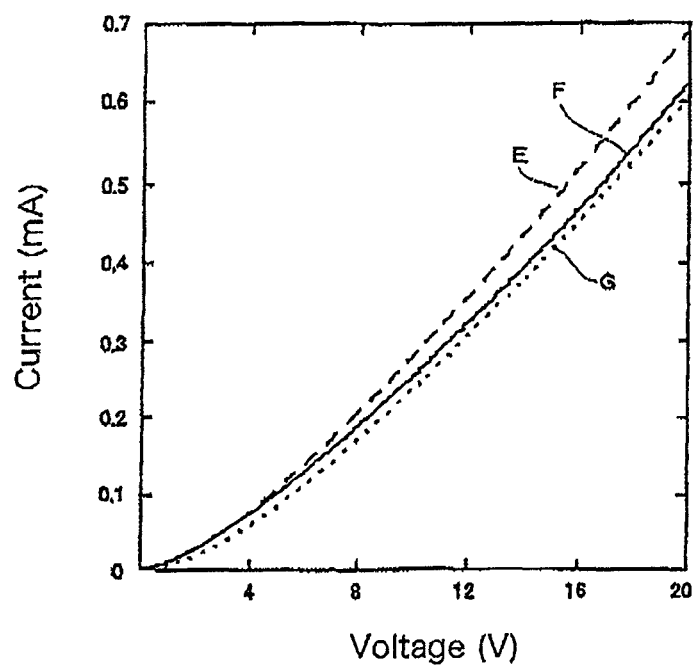
FIG. 5 shows a current/voltage characteristic of the electrode of the present invention and the Comparative Example 1.

A Ti electrode that has since been reported about was prepared by the same method as adopted in Embodiment 1. With the method for forming the Ti electrode, the Ti electrode was prepared by the lift-off method. An electrode structure was patterned by electron beam lithography. The Ti electrode was deposited by a vacuum evaporation method using Ti as an evaporation source. In order to prevent oxidation of Ti, Pt and Au were deposited on the Ti. Au as well as Pt was also deposited by the vacuum evaporation method. The degree of vacuum was not higher than $1\times10^{-8}$ Torr. After film formation, the Ti electrode was prepared by the lift-off method. Thereafter, a heat treatment at 420° C. was applied to a Ti/Pt/Au electrode in an argon gas. In FIG. 5, there is shown a current/voltage characteristic representing measurement results. In FIG. 5, a dotted line E indicates the characteristic of the $Ni_{80}Cr_{20}$ electrode according to the present invention, subjected to a heat treatment applied at 700° C., a solid line F indicates the characteristic of the $Ni_{80}Cr_{20}$ electrode, according to the present invention, subjected to the heat treatment applied at 420° C., and a dotted line G indicates a characteristic of the electrode according to Comparative Example 1. It was possible to confirm that, in the case of the NiCr electrode according to the present invention, the current is larger in magnitude as compared with the case of the Ti/Pt/Au electrode.

Embodiment 4

Figure 6:
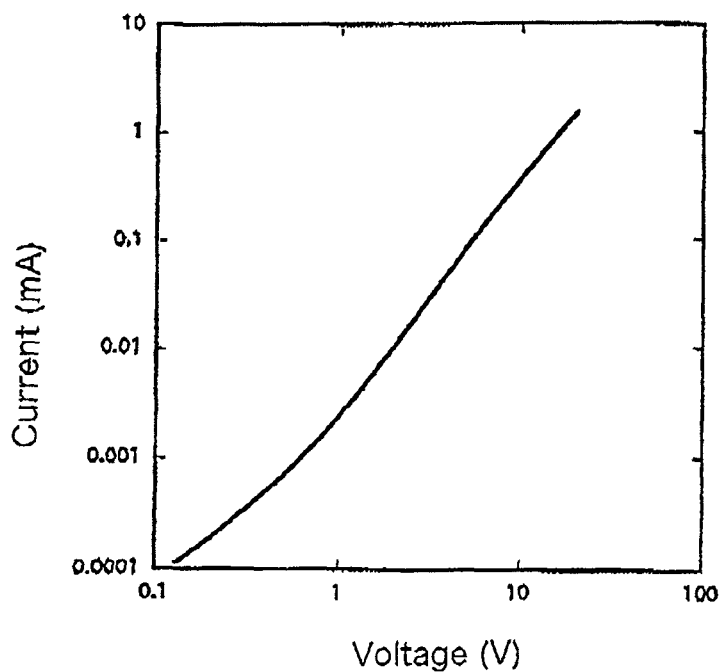
FIG. 6 shows a current/voltage characteristic of an electrode according to Embodiment 4 of the present invention wherein the electrode is not subjected to a heat treatment.

With Embodiment 4, an $Ni_{80}Cr_{20}$ electrode was formed on an oxygen-terminated, and n-type semiconductor diamond doped with phosphorus, thereby having examined the characteristic thereof, according to respective heat treatment conditions. For the diamond, use is made of an n-type diamond. The n-type diamond was deposited on a high-temperature, and high-pressure synthetic diamond (111) substrate by the microwave plasma enhanced CVD method. An n-type conductivity was obtained by doping the diamond with phosphorus. Use was made of the n-type semiconductor diamond doped with phosphorus ions $2.3\times10^{20}$ cm$^{-3}$. Then, an oxygen terminated surface was formed by applying a boiling treatment in a mixed solution of sulfuric acid and nitric acid at a temperature not lower than 200° C. to the semiconductor diamond for a period of not less than 60 minutes. Thereafter, an electrode pattern was formed by use of an electron beam lithography. The electrode pattern is comprised of two electrodes including a circular electrode and a doughnut-shaped electrode to thereby form a concentric ring structure, as shown in FIG. 1. An interval between the electrodes is 20 μm. The $Ni_{80}Cr_{20}$ electrode was deposited by a sputtering process. In the sputtering, use was made of an RF plasma sputtering system where the $Ni_{80}Cr_{20}$ electrode was deposited at 0.5 Pa of an Ar gas pressure, and at 200 w of RF power. In this case, $Ni_{80}Cr_{20}$ was used as a target. The electrode structure was prepared by a lift off method after deposition of $Ni_{80}Cr_{20}$. A current/voltage measurement was taken by applying a voltage across the two electrodes to thereby evaluate the current flowing therebetween. The measurement was taken at room temperature. In FIG. 6, there is shown a current/voltage characteristic representing the measurement results. As shown in FIG. 6, as an applied voltage increases, so does the current in magnitude. It is observed as an excellent ohmic electrode characteristic without requiring a heat treatment.

Figure 7:
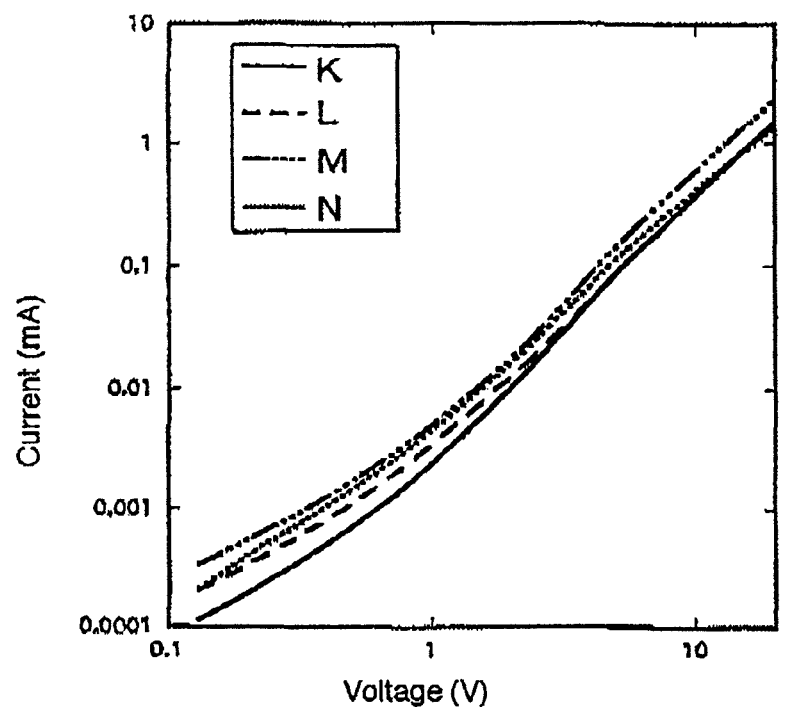
FIG. 7 shows a current/voltage characteristic of the electrode according to Embodiment 4 wherein the electrode is subjected to the heat treatment under various conditions.

Next, an evaluation on the current/voltage characteristic after application of a heat treatment was made in order to evaluate the effects of the heat treatment applied to the $Ni_{80}Cr_{20}$ electrode. The evaluation was made by measuring the current/voltage characteristic prior to the heat treatment, and making measurements on the same specimen after application of the heat treatment to thereby compare respective measurement results with each other. The heat treatment was applied under the conditions of a vacuum not higher than $1\times10^{-6}$ Torr for a period of 30 minutes. A current/voltage measurement was made at heat treatment temperatures of 420, 650, 800, and 1000° C., respectively, by applying a voltage across the two electrodes to thereby evaluate the current flowing therebetween. The measurement was conducted at room temperature. In FIG. 7, there is shown the current/voltage characteristic representing the measurement results. In FIG. 7, a solid line K indicates the characteristic of the $Ni_{80}Cr_{20}$ electrode that was not subjected to the heat treatment, a broken line L indicates the characteristic of the $Ni_{80}Cr_{20}$ electrode subjected to the heat treatment applied at 650° C., a dash and three-dotted line M indicates the characteristic of the $Ni_{80}Cr_{20}$ electrode subjected to the heat treatment applied at 800° C., and a dotted line N indicates the characteristic of the $Ni_{80}Cr_{20}$ electrode subjected to the heat treatment applied at 1000° C. The characteristic of the $Ni_{80}Cr_{20}$ electrode subjected to the heat treatment applied at 420° C. was found equivalent to that of the broken line L. As shown in FIG. 7, it was found out that as an applied voltage increased, so did a current value at any of the heat treatment temperatures. It was confirmed from the measurement results that the Ni—Cr electrode, either in the case of the heat treatment applied thereto or in the case of the heat treatment not applied thereto, is an excellent ohmic electrode irrespective of the heat treatment temperature. An excellent current/voltage characteristic was obtained at the heat treatment temperature in a range of 420 to 1000° C., including 420° C. in the case of Embodiment 1. Further, it has turned out that the characteristic indicated by the dash and three-dotted line M (the electrode subjected to the heat treatment applied at 800° C.), and the characteristic indicated by the dotted line N (the electrode subjected to the heat treatment applied at 1000° C.) are each larger in current value as compared with the cases of the solid line K, and the broken line L, respectively. Still further, the characteristic indicated by the broken line L (the electrode subjected to the heat treatment applied at 650° C.) also shows a high current value at a low voltage.

Embodiment 5

Figure 8:
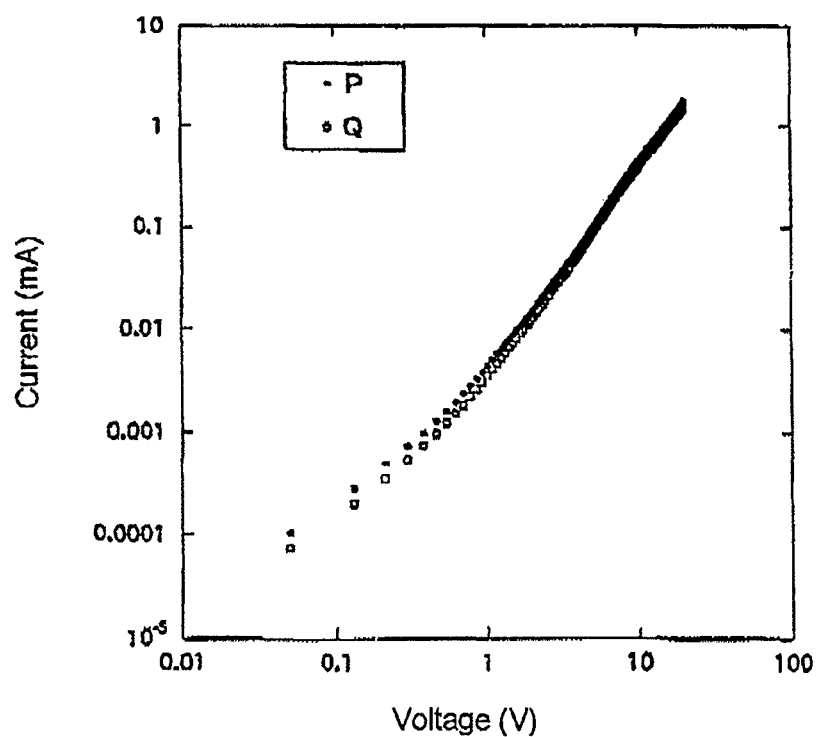
FIG. 8 shows a current/voltage characteristic before the high-temperature holding and after the high-temperature holding according to Embodiment 5 of the present invention.

With Embodiment 5, current/voltage characteristics before and after high temperature holding, respectively, were compared with each other to thereby evaluate heat resistance. For comparative specimens, use was made of the specimen of the electrode subjected to the heat treatment applied at 650° C., as shown in Embodiment 4. An $Ni_{80}Cr_{20}$ electrode was formed on an oxygen-terminated and n-type semiconductor diamond doped with phosphorus, thereby having examined the characteristic thereof, according to respective heat treatment conditions. For the diamond, use was made of an n-type diamond. The n-type diamond was deposited on a high-temperature and high-pressure synthetic diamond (111) substrate by the microwave plasma enhanced CVD method. An n-type conductivity was obtained by doping the diamond with phosphorus. Use was made of the n-type semiconductor diamond doped with phosphorus ions $2.3\times10^{20}$ cm$^{-3}$. Then, an oxygen terminated surface was formed by applying a boiling treatment in a mixed solution of sulfuric acid and nitric acid at a temperature not lower than 200° C. to the semiconductor diamond for a period of not less than 60 minutes. Thereafter, an electrode pattern was formed by the use of an electron beam lithography. The electrode pattern was comprised of two electrodes including a circular electrode and a doughnut-shaped electrode to thereby form a concentric ring structure, as shown in FIG. 1. An interval between the electrodes was 20 μm. The $Ni_{80}Cr_{20}$ electrode was deposited by a sputtering process. In the sputtering, use was made of an RF plasma sputtering system where the $Ni_{80}Cr_{20}$ electrode was deposited at 0.5 Pa of an Ar gas pressure and at 200 w of RF power. In this case, $Ni_{80}Cr_{20}$ was used as a target. The electrode structure was prepared by a lift-off method after deposition of $Ni_{80}Cr_{20}$. Thereafter, the heat treatment was applied to the specimen under conditions that the specimen is placed in a vacuum at 650° C., and not higher than $1\times10^{-6}$ Torr for a period of 30 minutes. The current/voltage characteristic of the specimen was thereby evaluated. Subsequently, the specimen was held at a high temperature. High temperature holding of the specimen was carried out under conditions that the specimen is placed in a vacuum at 400° C., and not higher than $1\times10^{-7}$ Torr for a period of 1 hour. In FIG. 8, there is shown the current/voltage characteristic. In FIG. 8, a hollow-dotted line Q indicates the characteristic of the specimen before the high-temperature holding, and a heavy-dotted line P indicates the characteristic of the specimen after the high-temperature holding. Since a large difference was not observed between the current/voltage characteristic before the high-temperature holding, and that after the high-temperature holding, it was possible to confirm that the electrode according to Embodiment 5 was a highly heat-resistant electrode.

Embodiment 6

With Embodiment 6, the contact resistance of an $Ni_{72}Cr_{18}Si_{10}$ electrode was evaluated. An evaluation on the contact resistance was made by the c-TML method. Dual-electrode structures each were comprised of a circular electrode, and a doughnut-shaped electrode to form a concentric ring structure, and the dual-electrode structures were designed to have inter-electrode distances differing from each other, more specifically, the inter-electrode distances being 2, 4, 6, 8, 10, 12, 14, 16, and 18 μm, respectively. Each of the $Ni_{72}Cr_{18}Si_{10}$ electrodes having such dual-electrode structures differing from each other as described was formed on an oxygen-terminated and n-type semiconductor diamond doped with phosphorus, and an evaluation were made on respective contact resistances.

The steps of manufacturing a semiconductor diamond device according to the present embodiment were taken in the following sequence. First, an n-type semiconductor diamond doped with phosphorus ions on the order of $8\times10^{19}$ cm$^{-3}$ was synthesized on a high-temperature, and high-pressure synthetic Ib diamond substrate (111) plane by the microwave plasma enhanced CVD method. A synthesized n-type diamond thin film had a resistivity in a range of 300 to 500 Ωcm. Next, an oxygen-terminated structure was formed by application of an oxygen plasma treatment. An electrode structure was patterned by electron beam lithography, thereby forming an $Ni_{72}Cr_{18}Si_{10}$ film. The $Ni_{72}Cr_{18}Si_{10}$ electrode was deposited by the sputtering process with the use of $Ni_{72}Cr_{18}Si_{10}$ as a target. In sputtering, use was made of an RF plasma sputtering system where the $Ni_{72}Cr_{18}Si_{10}$ electrode was deposited at 0.5 Pa of an Ar gas pressure and at 200 w of RF power. In order to prevent oxidation of the $Ni_{72}Cr_{18}Si_{10}$ electrode, platinum was continuously deposited on specimens of the $Ni_{72}Cr_{18}Si_{10}$ electrode by the sputtering process applied in the same sputtering system without exposing the specimens to the atmosphere so as to be used as a protection film of the $Ni_{72}Cr_{18}Si_{10}$ electrode. Thereafter, an electrode structure was formed by the lift off method. In the last step, a teat treatment at 420° C. was applied thereto in an argon gas.

The evaluation on the contact resistance was made according to the following procedure. First, cleaning of a diamond surface was executed by use of the oxygen plasma treatment. The oxygen plasma treatment was carried out under conditions of 100 Pa of an oxygen atmosphere pressure and 300 W of RF plasma power for 300 seconds as treatment time. After the cleaning of the surface, the current/voltage characteristics at the respective inter-electrode distances were measured, thereby having estimated a contact resistance, which was $5\times10^{-4}$ Ωcm$^2$.

Comparative Example 2

With Comparative Example 2, a Ti electrode which has been used conventionally as an ohmic electrode for a diamond was prepared in the same method as described in the case of Embodiment 6 and the contact resistance was estimated in the same manner as Embodiment 6. An evaluation on the contact resistance was made by the c-TML method. Dual-electrode structures, each comprising a circular electrode and a doughnut-shaped electrode to form a concentric ring structure and were designed to have inter-electrode distances differing from each other, more specifically, the inter-electrode distances being 2, 4, 6, 8, 10, 12, 14, 16, and 18 μm, respectively. Each of the Ti electrodes having such dual-electrode structures differing from each other as described was formed on an oxygen-terminated and n-type semiconductor diamond doped with phosphorus, and an evaluation was made on respective contact resistances.

The steps of manufacturing a semiconductor diamond device according to Comparative Example 2 were taken in the following sequence. First, an n-type semiconductor diamond doped with phosphorus ions on the order of $8\times10^{19}$ cm$^{-3}$ was synthesized on a high-temperature and high-pressure synthetic Ib diamond substrate (111) plane by the microwave plasma enhanced CVD method. A synthesized n-type diamond thin film had a resistivity in a range of 300 to 500 Ωcm. Next, an oxygen-terminated structure was formed by application of an oxygen plasma treatment. An electrode structure was patterned by the electron beam lithography, thereby having formed a Ti film. In order to prevent oxidation of the Ti electrode, platinum was continuously deposited on specimens of the Ti electrode by the sputtering process applied in the same sputtering system without exposing the specimens to the atmosphere so as to be used as a protection film of the Ti electrode. Thereafter, an electrode structure was formed by the lift-off method. In the last step, a heat treatment at 420° C. was applied thereto in an argon gas.

The evaluation on the contact resistance was made according to the following procedure. First, cleaning of a diamond surface was executed by use of the oxygen plasma treatment. The oxygen plasma treatment was as follows. The oxygen plasma treatment was carried out under conditions of 100 Pa of an oxygen atmosphere pressure and 300 W of RF plasma power for 300 seconds as treatment time. After the cleaning of the surface, the current/voltage characteristics at the respective inter-electrode distances were measured, thereby having estimated a contact resistance, which was $3.6\times10^{-2}$ Ωcm$^2$.

Upon comparison of the contact resistance according to Embodiment 6 with the contact resistance according to Comparative Example 2, it turned out that with the $Ni_{72}Cr_{18}Si_{10}$ electrode according to the present invention, the contact resistance could be reduced by two orders of magnitude. Further, with the $Ni_{72}Cr_{18}Si_{10}$ electrode according to the present invention, the contact resistance was reduced by ten orders of magnitude as compared with the Ti electrode according to Non-patent Document 1. Furthermore, it was possible to reduce the contact resistance by one order of magnitude as compared with the Ti electrode (Non-patent Document 4) having the intermediate layer highly doped with phosphorus ions.

Embodiment 7

With Embodiment 7, a contact resistance of an $Ni_{72}Cr_{18}Si_{10}$ electrode, after high-temperature holding, was measured and an evaluation of the heat resistance of the contact resistance was made. Specimens of the $Ni_{72}Cr_{18}Si^{10}$ electrode were prepared by the same method as described in the case of Embodiment 6.

Figure 9:
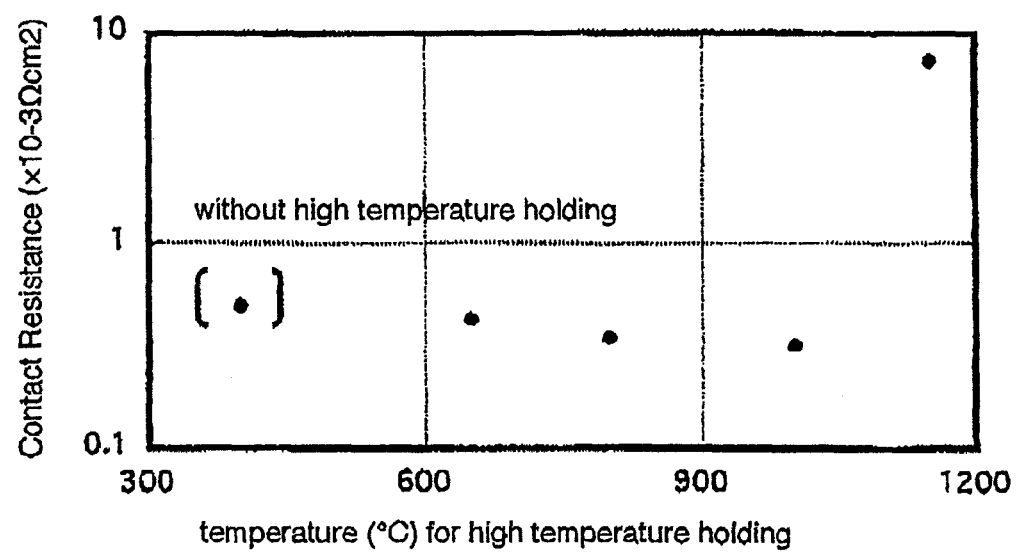
FIG. 9 shows the contact resistances of electrodes according to Embodiments 6 and 7 of the present invention.

The contact resistances of the specimens, respectively, were estimated by use of the c-TML method after high-temperature holding in order to examine effects of high-temperature holding and a variation in the contact resistance was evaluated. The high-temperature holding was carried out under conditions that an argon atmosphere pressure was at 1 Pa, retention time was for 1 hour and the holding temperature was sequentially varied from 650, 800, 1000 and 1150° C., respectively. Cleaning of the diamond surface was executed by use of the oxygen plasma treatment after the high-temperature holding. An evaluation on the contact resistance was made according to the following procedure. First, the cleaning of the diamond surface was executed by use of the oxygen plasma treatment. Conditions for the oxygen plasma treatment were as follows. An oxygen atmosphere pressure was set to 100 Pa, an RF plasma power was set to 300 W, and treatment time was set to 300 seconds. After the cleaning of the surface, the current/voltage characteristics at respective inter-electrode distances were measured at room temperature and in the atmosphere. In FIG. 9, there are shown the contact resistances estimated from the current/voltage characteristics, respectively. For reference purposes, the contact resistance without the high-temperature holding, as is the case with Embodiment 6, is also shown in parentheses. The contact resistances at respective temperatures for the high-temperature holding, more specifically, the contact resistances at 650, 800, 1000 and 1150° C., respectively, were estimated at $4.3\times10^{-4}$, $3.5\times10^{-4}$, $3.5\times10^{-4}$ and $7.5\times10^{-3}$ $\Omega cm^2$, respectively. It has turned out from this result that the contact resistance did not increase, even after the high-temperature holding at 1000° C., thereby indicating an excellent heat-resistance characteristic.

Comparative Example 3

With Comparative Example 3, the contact resistance of a Ti electrode which has been used conventionally as an ohmic electrode for a diamond, after high-temperature holding, was measured, and an evaluation of the heat resistance of the contact resistance was made. Specimens of the Ti electrode were prepared by the same method as described in the case of Embodiment 6.

The contact resistances of the specimens, respectively, were estimated by use of the c-TML method after high-temperature holding in order to examine the effects of high-temperature holding and variation in the contact resistance was evaluated in the same manner as made in the case of Embodiment 6. The high-temperature holding was carried out under the same conditions as in Embodiment 7. Cleaning of the diamond surface was executed by use of the oxygen plasma treatment after the high-temperature holding. An evaluation of the contact resistance was made according to the following procedure. First, the cleaning of the diamond surface was executed by use of the oxygen plasma treatment under the same conditions as made in Embodiment 7. After the cleaning of the surface, the current/voltage characteristics at respective inter-electrode distances were measured at room temperature and in the atmosphere. In FIG. 9, there are shown the contact resistances estimated from the current/voltage characteristics, respectively. For reference purposes, the contact resistance without the high-temperature holding, as is the case with Comparative Example 2, is also shown in parentheses. The contact resistances at respective temperatures for the high-temperature holding, more specifically, the contact resistances at 650, 800 and 1000° C., respectively, were estimated at $1.1\times10^{-2}$, 0.11, 0.19 $\Omega cm^2$, respectively.

By comparison of the contact resistance value after the high-temperature holding, in the case of Embodiment 7 with that in the case of Comparative Example 3, it has turned out that, in contrast to the case of the Ti electrode where the contact resistance noticeably increased due to the high-temperature holding, the contact resistance in the case of Embodiment 7 did not increase, even at 1000° C. This shows that the electrode according to the present invention is an ohmic electrode having an excellent heat resistance. With the electrode according to the present invention, it was possible to improve by 350° C. in terms of heat resistance as compared with the Ti electrode.

Figure 10:
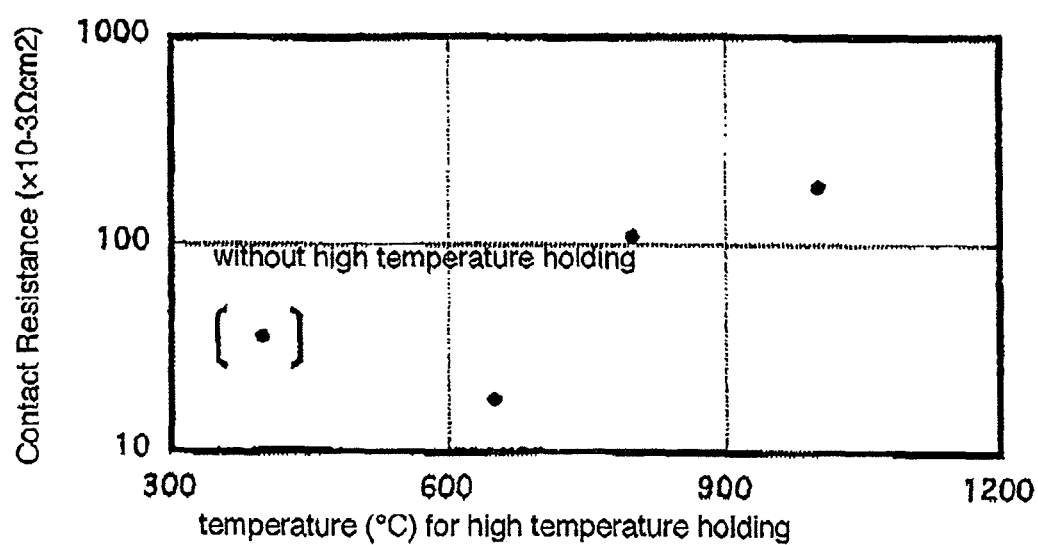
FIG. 10 shows a contact resistance of a Ti electrode according to Comparative Examples 2 and 3.

According to Embodiments 6 and 7 of the present invention, respectively, it is possible to obtain an ohmic electrode for use in a semiconductor diamond device having a contact resistance at $5\times10^{-4}$ $\Omega cm^2$, and less than 0.001 $\Omega cm^2$, whereas the contact resistance of the Ti electrode was $3.6\times10^{-2}$ $\Omega cm^2$. Further, in contrast to the case of the Ti electrode, where the contact resistance turns to $10\times10^{-3}$ $\Omega cm^2$ or higher before, and after the high-temperature holding, as is evident from FIG. 10, the contact resistance in the case of the embodiment of the present invention is $(0.1$ to $1)\times10^{-3}$ $\Omega cm^2$ before the high-temperature holding, and after temperature-holding in a range from 650 to 1000° C., as is evident from FIG. 9. The electrode according to the embodiment of the present invention has such a high heat resistance that the contact resistance after high-temperature holding at 1000° C. for one hour is less than 0.001 $\Omega cm^2$. The electrode according to the present invention has a resistance value lower than the contact resistance value before high-temperature holding, as shown in FIG. 9, whereas the contact resistance of the Ti electrode, in particular, tends to increase due to high-temperature holding, as pointed to in FIG. 10 showing the Ti electrode. The electrode according to the present invention has therefore a feature in that the contact resistance after high-temperature holding kept at a temperature in a range of 800 to 1000° C. for 1 hour is lower than the contact resistance value before the high-temperature holding.

According to the embodiments described in the foregoing, with the heat treatment temperature falling in a range of 420 to 1000° C., an excellent current/voltage characteristic can be obtained. Further, it can be said on the basis of Embodiment 4 that the heat treatment temperature in a range of 650 to 1000° C. is more preferable. Further, in consideration of the case of Embodiment 2 (the heat treatment was applied at 700° C.), an ohmic electrode having an excellent current/voltage characteristic is obtainable by application of the heat treatment in a range of 700 to 1000° C., and such a heat treatment is therefore more preferable. Further, as the atmosphere at the time of the heat treatment, an argon atmosphere is mentioned by way of example, however, the heat treatment can be applied in a vacuum or an inert gas such as an nitrogen gas, and so forth.

The electrode according to the present invention is comprised of the NiCr alloy, or the compound containing NiCr. For the NiCr alloy, use can be made of an alloy comprised of Ni and Cr, only, or the alloy containing NiCr as a major constituent together with at least one element selected from the group consisting of Fe, Ti, Mn, Mo, Nb, Cu, AL, W, Ta and Ga. If the Ni content is 100%, the electrode will not function as an ohmic electrode, so that an Ni/(Ni+Cr) ratio is set to a range of from 1 to 99 wt % (weight %). As to examples of the alloy comprised of Ni, and Cr, the $Ni_{80}Cr_{20}$ electrode, and the $Ni_{85}Cr_{15}$ electrode are representative examples, as shown in Embodiments 1 and 2, respectively, however, these electrodes each are merely one example. Examples of the nickel-chromium alloy include alloys containing Ni and Cr, such as 85Ni-15Cr containing 85 wt % of Ni, and 15 wt % of Cr, 80Ni-20Cr containing 80 wt % of Ni, and 20 wt % of Cr, 60Ni-40Cr containing 60 wt % of Ni, and 40 wt % of Cr, 40Ni-60Cr containing 40 wt % of Ni, and 60 wt % of Cr, 20Ni-80Cr containing 20 wt % of Ni, and 80 wt % of Cr, and so forth.

Further, the Examples of the nickel-chromium alloy, may include an alloy or a compound, containing Ni, Cr, and other elements X (X refers to Fe, Ti, Mn, Mo, Nb, Cu, Al, W, Ta, Ga, Si, C, and N). The compound includes, for example, a Ni-based super alloy such as $Ni_{76}Cr_{15.5}Fe_{8}X_{0.5}$, and $Ni_{41.5}Cr_{18}Ti_{7.5}X_{35}$ (X refers to Mn, Mo, Nb, Cu, Al, W, Ta, Ga, Si, C, and N), and a nimonic based super alloy such as $Ni_{77}Cr_{19.5}Si_{1}X_{2.5}$ (X refers to Fe, Ti, Mn, Mo, Nb, Cu, Al, W, Ta, Ga, C, and N), and so forth, from the viewpoint of thermal stability. As to examples of the compound containing Ni and Cr, the $Ni_{72}Cr_{18}Si_{10}$ electrode {$(Ni_{80}Cr_{20})_{90}Si_{10}$ electrode} according to Embodiment 3 and an Ni—Cr—Fe electrode are representative examples, however, those examples each are nothing but a mere example. The alloy and the compound each preferably have a chemical composition including Ni in a range of 32.5 to 85 wt % and Cr in a range of 12.8 to 30 wt % from the viewpoint of thermal and chemical stability. Further, if the ohmic electrode is formed of an alloy or a compound containing Ni in a range of 72 to 85 wt % and Cr in a range of 15 to 20 wt % on the basis of the compositions according to the respective embodiments of the invention, this will be more preferable.

As to a method for manufacturing the electrode, a sputtering process such as the plasma sputtering process is shown by way of example, however, it need only be sufficient to use a conventional method known as a method for forming an NiCr alloy or compound film.

Further, as to the electrode structure, a special shape (shown in FIG. 1) for the purpose of the evaluation is shown with reference to the respective embodiments of the invention, however, the electrode according to the present invention can be carried out with the use of an electrode structure adopted in a semiconductor device.

With reference to the respective embodiments of the invention, there is shown the case where the semiconductor diamond on which the electrode is formed is an oxygen-terminated and n-type semiconductor diamond doped with phosphorus by way of example. However, the present invention is not limited thereto and use may be made of any type of semiconductor diamond. For a crystal structure of the semiconductor diamond, directions of crystal planes including (001), (111), (110), and so forth can be cited, and the ohmic electrode according to the present invention is formed on an n-type semiconductor diamond doped with sulfur, lithium, nitrogen, and so forth, other than phosphorus, or a p-type semiconductor diamond doped with boron, and so forth. For the diamond surface, a carbon-terminated diamond, a hydrogen-terminated diamond, and an oxygen-terminated diamond, and so forth can be cited. With the respective embodiments of the present invention, the oxygen-terminated diamond is in use for the following reason. A diamond is synthesized in a hydrogen-rich atmosphere and hydrogen terminates at the surface thereof. This hydrogen-terminated surface has electrical conductivity irrespective of the type of electrical conductivity of the semiconductor. In order to evaluate a diamond as a semiconductor, it is necessary to cancel out such electrical conductivity as described, so that it is a common practice to form an oxygen termination. Further, for the crystal structure of the semiconductor diamond, use can be made of a single crystal diamond with the direction of the crystal plane, such as the (001) plane, (110) plane, and so forth, other than the (111) plane in the case of the embodiment of the present invention, or a polycrystalline diamond. In the case of using the polycrystalline diamond, there is no limitation to a grain size.

With the present invention, the contact resistance value of the electrode can be reduced by not less than one order of magnitude as compared with the conventional Ti electrode. Because the NiCr alloy or the compound containing NiCr is of a chemically stable structure, there is no possibility that a formed substance causing an increase in contact resistance will be formed at an interface with the diamond, so that the contact resistance can be reduced to less than 0.001 $\Omega cm^2$ not only in the case of the electrode having the compositions of Embodiments 6, 7, respectively, but also in the case of the electrode according to the present invention, comprising the NiCr alloy or the compound containing NiCr. Further, with the present invention, the electrode has the feature in that the contact resistance after the high-temperature holding similarly does not increase, being lower than the contact resistance value before the high-temperature holding. Since it is known that the NiCr alloy, or the compound containing NiCr, is generally excellent in heat resistance, the contact resistance does not increase even after the high-temperature holding, unlike the case of the Ti electrode.

Having described the embodiments of the invention as above by way of example, it is to be pointed out that the examples are described for the sake of clarity and that the present invention is not limited thereto.

The invention claimed is:

1. An ohmic electrode for use in an n-type semiconductor diamond device, comprising a nickel-chromium alloy or a nickel-chromium-silicon compound, wherein said nickel-chromium alloy is $Ni_{80}Cr_{20}$ or $Ni_{85}Cr_{15}$ and said nickel-chromium-silicon compound is $Ni_{72}Cr_{18}Si_{10}$.

2. A semiconductor diamond device provided with an ohmic electrode for use in an n-type semiconductor diamond device, said ohmic electrode being provided on an n-type semiconductor diamond and being comprised of a nickel-chromium alloy or a nickel-chromium-silicon compound, wherein said nickel-chromium alloy is $Ni_{80}Cr_{20}$ or $Ni_{85}Cr_{15}$ and said nickel-chromium-silicon compound is $Ni_{72}Cr_{18}Si_{10}$.

3. A method for manufacturing a semiconductor diamond device, said method comprising the steps of preparing a semiconductor diamond and forming an ohmic electrode on said semiconductor diamond, said ohmic electrode being comprised of a nickel-chromium alloy or a nickel-chromium-silicon compound, wherein said nickel-chromium alloy is $Ni_{80}Cr_{20}$ or $Ni_{85}Cr_{15}$ and said nickel-chromium-silicon compound is $Ni_{72}Cr_{18}Si_{10}$.

4. The semiconductor diamond device according to claim 2, wherein the n-type semiconductor diamond is doped with phosphorus.

5. The method for manufacturing a semiconductor diamond device according to claim 3, wherein the semiconductor diamond is an n-type semiconductor diamond doped with phosphorus.

6. The semiconductor diamond device according to claim 2, wherein the n-type semiconductor diamond is doped with phosphorus.

\* \* \* \* \*